(12) United States Patent
Sasaki et al.

(10) Patent No.: US 8,968,526 B2
(45) Date of Patent: Mar. 3, 2015

(54) METHOD FOR MANUFACTURING MAGNETIC RECORDING MEDIUM, MAGNETIC RECORDING MEDIUM, AND MAGNETIC RECORDING AND REPRODUCING APPARATUS

(75) Inventors: Shingo Sasaki, Ichinoseki (JP); Shin Saito, Sendai (JP); Migaku Takahashi, Sendai (JP); Atsushi Hashimoto, Chiba (JP); Yuzo Sasaki, Ichihara (JP); Gohei Kurokawa, Ichihara (JP); Tomoyuki Maeda, Kawasaki (JP); Akihiko Takeo, Tokyo (JP)

(73) Assignees: Showa Denko K.K., Tokyo (JP); Kabushiki Kaisha Toshiba, Tokyo (JP); Tohoku University, Miyagi-ken (JP)

( * ) Notice: Subject to any disclaimer, the term of this patent is extended or adjusted under 35 U.S.C. 154(b) by 707 days.

(21) Appl. No.: 12/692,354

(22) Filed: Jan. 22, 2010

(65) Prior Publication Data
US 2010/0188772 A1 Jul. 29, 2010

(30) Foreign Application Priority Data
Jan. 27, 2009 (JP) ................. 2009-015635

(51) Int. Cl.
*C23C 14/34* (2006.01)
*G11B 5/851* (2006.01)
(Continued)

(52) U.S. Cl.
CPC .............. *G11B 5/851* (2013.01); *C23C 14/14* (2013.01); *C23C 14/34* (2013.01); *G11B 5/65* (2013.01); *G11B 5/82* (2013.01); *Y02T 50/67* (2013.01)
USPC ................................. 204/192.2

(58) Field of Classification Search
USPC ................................. 204/192.2
See application file for complete search history.

(56) References Cited

U.S. PATENT DOCUMENTS 7,226,674 B2 6/2007 Koda et al.
7,470,474 B2 12/2008 Sakawaki et al.
(Continued)

FOREIGN PATENT DOCUMENTS

EP 1 942 205 A2 * 7/2008
JP 2002-342908 A 11/2002
(Continued)

OTHER PUBLICATIONS

Machine Translation JP 2008-108415 dated May 2008.*
(Continued)

*Primary Examiner* — Rodney McDonald
(74) *Attorney, Agent, or Firm* — Sughrue Mion, PLLC

(57) ABSTRACT

There are provided a method for manufacturing a magnetic recording medium which is excellent in terms of both the recording and reproduction characteristics and the thermal fluctuation characteristics without reducing the density and hardness of the perpendicular magnetic layer; a magnetic recording medium; and a magnetic recording and reproducing apparatus with which an excellent recording density is achieved, wherein, in the method for manufacturing the magnetic recording medium, at least a portion of the perpendicular magnetic layer 4 is formed as a magnetic layer having a granular structure that contains Co as a major component and also contains an oxide of at least one nonmagnetic metal selected from the group consisting of Cr, Si, Ta, Al, Ti, W and Mg;

a target for forming the perpendicular magnetic layer 4 by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target higher than the proportion of oxygen contained in the perpendicular magnetic layer 4; and a sputtering gas pressure at the time of forming the perpendicular magnetic layer is set to 1 Pa or less.

9 Claims, 4 Drawing Sheets

(51) Int. Cl.
*C23C 14/14* (2006.01)
*G11B 5/65* (2006.01)
*G11B 5/82* (2006.01)

(56) References Cited

U.S. PATENT DOCUMENTS

| | | | |
|---|---|---|---|
| 7,494,617 B2 | 2/2009 | Ziani | |
| 2002/0187368 A1 | 12/2002 | Senzaki et al. | |
| 2006/0088737 A1* | 4/2006 | Hirayama et al. | 428/836.2 |
| 2006/0289294 A1* | 12/2006 | Racine et al. | 204/192.2 |
| 2007/0059561 A1* | 3/2007 | Uwazumi et al. | 428/832 |

FOREIGN PATENT DOCUMENTS

| | | |
|---|---|---|
| JP | 2004-259423 A | 9/2004 |
| JP | 2004-310910 A | 11/2004 |
| JP | 2006-299401 A | 11/2006 |
| JP | 2007-164826 A | 6/2007 |
| JP | 2007-272990 A | 10/2007 |
| JP | 2008-108415 A | 5/2008 |

OTHER PUBLICATIONS

Machine Translation JP 2006-299401 dated Nov. 2006.*

Machine Translation JP 2004-259423 dated Sep. 2004.*

M. Zheng, et al., "Role of Oxygen Incorporation in Co—Cr—Pt—Si—O Perpendicular Magnetic Recording Media," IEEE Transactions on Magnetics, Jul. 2004, pp. 2498-2500, vol. 40, No. 4.

Japanese Office Action issued in Japanese Application No. 2009-015635 mailed Aug. 7, 2012.

* cited by examiner

METHOD FOR MANUFACTURING MAGNETIC RECORDING MEDIUM, MAGNETIC RECORDING MEDIUM, AND MAGNETIC RECORDING AND REPRODUCING APPARATUS

BACKGROUND OF THE INVENTION

1. Field of the Invention

The present invention relates to a method for manufacturing a magnetic recording medium, a magnetic recording medium, and a magnetic recording and reproducing apparatus.

Priority is claimed on Japanese Patent Application No. 2009-015635, filed Jan. 27, 2009, the content of which is incorporated herein by reference.

2. Description of the Related Art

The recording density of hard disk devices (HDD), which are one type of magnetic recording and reproducing apparatus, is currently increasing at an annual rate of 50% or higher, and it is expected that this trend will continue in the future. Consequently, the development of magnetic recording heads, and the development of magnetic recording media suitable for high density recording is being advanced.

Currently, as a magnetic recording medium that is installed in the commercially available magnetic recording and reproducing apparatus, a so-called perpendicular magnetic recording medium is used, in which the axis of easy magnetization within a magnetic film is mainly oriented perpendicularly. In the perpendicular magnetic recording medium, even when recording density is increased, there is an advantage in that the effects of a demagnetizing field formed in the boundary region between recording bits are small and distinct bit boundaries are formed, thus enabling noise reduction. Furthermore, in the perpendicular magnetic recording medium, since reduction in recording bit volume associated with the increase in recording density can be suppressed, there is also an advantage in that thermal stability can also be enhanced. Therefore, in recently years, a perpendicular magnetic recording medium has become of keen interest, and various medium structures suitable for perpendicular magnetic recording have been proposed.

Further, in recent years, in response to demand for magnetic recording media of higher recording density, employment of a single magnetic pole head exhibiting excellent ability to record data onto a perpendicular magnetic layer has been studied. In order to employ such a single magnetic pole head, there has been proposed a magnetic recording medium in which a layer formed of a soft magnetic material (called a "backing layer") is provided between a perpendicular magnetic layer serving as a recording layer and a substrate, thereby enhancing the efficiency of magnetic flux flow between the single magnetic pole head and the medium.

However, when a magnetic recording medium simply provided with a backing layer is used as described above, adequate levels of various characteristics, such as the recording and reproducing characteristics during the recording/reproducing process, the resistance to thermal fluctuation and the recording resolution, cannot be attained, and thus demand for an excellent magnetic recording medium in terms of these characteristics has been increasing.

In particular, achieving both the increase in the ratio of signal to noise (S/N ratio) during reproduction and the improvement in the resistance to thermal fluctuation, which are factors important as the recording and reproducing characteristics, is essential for the future high density recording.

However, these two factors are incompatible with each other, and when improving the level of one factor, the level of the other factor becomes inadequate, and thus it has become important issue to achieve high levels in both of these factors at the same time.

In order to solve the above-mentioned problem and to improve the recording and reproducing characteristics and thermal fluctuation characteristics of perpendicular magnetic recording medium, a method has been proposed for enhancing the perpendicular orientation properties of magnetic layers by using an orientation control layer and preparing a multiple magnetic layers as a continuous columnar crystal of crystal particles in each magnetic layers (for example, refer to FIG. 2 in Patent Document 1 (Japanese Unexamined Patent Application, First Publication No. 2004-310910)).

In addition, as the orientation control layer mentioned above, for example, use of Ru has been proposed (for example, refer to Patent Document 2 (Japanese Unexamined Patent Application, First Publication No. 2007-272990). The orientation control layer composed of Ru that is disclosed in Patent Document 2 has a dome-shaped convex portion on the growing surface thereof. Accordingly, by growing the crystal particles in the magnetic layers and the like on the convex portion and by promoting the separation of grown crystal particle structures and thereby isolating the crystal particles, magnetic particles are effectively grown into a columnar shape.

Further, as a method for reducing the level of magnetic interactions among the magnetic crystal particles by magnetically separating and isolating the magnetic crystal particles, a method has been proposed in which $SiO_2$ or the like is added to the magnetic layer to form a perpendicular magnetic recording layer having a so-called granular structure, which is surrounded by the grain boundary regions where magnetic crystal particles contain a large amount of $SiO_2$ or the like (for example, refer to Patent Document 3 (Japanese Unexamined Patent Application, First Publication No. 2002-342908).

In addition, as a method for forming a perpendicular magnetic recording layer having a granular structure, a method has been disclosed in which a perpendicular magnetic recording layer having a granular structure is formed by using a composite-type target containing a CoCrPt alloy as well as $SiO_2$ through a DC magnetron sputtering process in the atmosphere of mixed gas composed of argon and oxygen (for example, refer to Non-Patent Document 1 (IEEE Transactions on Magnetics, Vol. 40, No. 4, July 2004, p. 2498-2500). In Non-Patent Document 1, it has been disclosed that by conducting a reactive sputtering process in the atmosphere containing oxygen, the level of coercive force increases and the recording and reproducing characteristics also improve. Moreover, in Non-Patent Document 1, it has been disclosed that the optimal oxygen partial pressure is determined by the $SiO_2$ concentration, and the level of optimal oxygen partial pressure increases as the $SiO_2$ concentration reduces, and that when the oxygen concentration exceeds the optimal value and become excessive, the magnetic characteristics and recording and reproducing characteristics are considerably deteriorated.

Furthermore, a method has been proposed in which when forming a CoCrPt—SiO2-based magnetic film by a sputtering process, since the sputtering efficiency is enhanced by reducing the magnetism of a target, a Co mother alloy which is to become a ferromagnetic alloy is contained in the target in the forms of CoO and CoSi, thereby reducing the level of the target magnetism (for example, refer to Patent Document 4 (Japanese Unexamined Patent Application, First Publication No. 2006-299401).

As described above, the demand for higher recording density with respect to the magnetic recording media has been continuously increasing, and more improvements than ever before in the recording and reproducing characteristics and the thermal fluctuation characteristics have been required for the magnetic recording media. In addition, as the extent of spacing between the head and the magnetic recording medium is decreasing, improvements in the scratch resistance of magnetic recording media have also been required so that the data can be retained even if the head and the magnetic recording medium are brought into contact.

In order to meet such demands, it is required to use a magnetic layer having a granular structure as disclosed in Non-Patent Document 1 or the like, while increasing the extent of magnetic separation and isolation of magnetic crystal particles constituting the granular structure. Further, also in terms of the method for forming a perpendicular magnetic layer exhibiting excellent electromagnetic conversion characteristics and having a granular structure, a method disclosed in Non-Patent Document 1 or the like has been adopted in which a reactive sputtering process is carried out in the atmosphere containing oxygen.

As the above-mentioned method, when forming a magnetic layer having a granular structure using a reactive sputtering process, it is necessary to increase the gas pressure in order to prevent the desorption of oxygen. However, when the present inventors and others have conducted intensive and extensive studies, it became apparent that when the gas pressure was increased during the sputter deposition process, the density of magnetic layer was reduced and the film hardness was also reduced. For this reason, it is thought that, for example, the above-mentioned problem can be solved by forming a magnetic layer having a granular structure at a low sputtering gas pressure. Here, in order to form a magnetic layer having a granular structure at a low gas pressure, for example, it is necessary to strictly control the film forming conditions and stabilize the concentration of oxygen contained in the film using a magnetron sputtering apparatus. However, since a target containing a magnetic alloy exhibits a high level of magnetic permeability and the level of magnetic flux flowing through is reduced, it becomes difficult to strictly control the sputtering conditions using a magnetron.

SUMMARY OF THE INVENTION

The present invention is made in view of the above problems and its object is to provide a method for manufacturing a magnetic recording medium which is excellent in terms of all the recording and reproduction characteristics, the thermal fluctuation characteristics and the scratch resistance, without reducing the density and hardness of the perpendicular magnetic layer.

Further, another object of the present invention is to provide a magnetic recording medium obtained by the manufacturing method of the present invention as described above, which is excellent in terms of both the recording and reproduction characteristics and the resistance to thermal fluctuation, and is also capable of achieving high recording density.

In addition, yet another object of the present invention is to provide a magnetic recording and reproducing apparatus that includes the above-mentioned magnetic recording medium of the present invention and with which an excellent recording density is achieved.

The present inventors and others have conducted intensive and extensive studies regarding the film forming conditions when forming a perpendicular magnetic layer having a granular structure by a sputtering process.

As described above, since it is necessary to increase the gas pressure when forming a magnetic layer having a granular structure by employing a sputtering process, a problem arises in that the density of the magnetic layer reduces, thereby reducing the film hardness. On the other hand, when forming a magnetic layer having a granular structure at a low gas pressure, it is necessary to strictly control the film forming conditions and stabilize the concentration of oxygen contained in the film using a magnetron sputtering apparatus. However, since the level of magnetic flux flowing through the target that contains a magnetic alloy reduces, it becomes difficult to strictly control the film forming conditions.

For this reason, the present inventors and others have repeatedly conducted intensive and extensive studies in order to find out a method in which the film forming conditions can be stably controlled even when the gas pressure at the time of forming a perpendicular magnetic layer having a granular structure by a sputtering process is low. As a result, the present inventors discovered that it is possible to reduce the gas pressure by using an oxide of Co and a compound of Co and a nonmagnetic metal as a target for forming a perpendicular magnetic layer by a sputtering process, and by increasing the proportion of oxygen contained in the target. The present inventors have discovered that due to this configuration, it is possible to form a perpendicular magnetic layer having high hardness and also exhibiting excellent electromagnetic conversion characteristics, thereby completing the present invention.

That is, the present invention adopts the aspects described below.

A first aspect of the present invention is a method for manufacturing a magnetic recording medium,
the method characterized by having
a step for at least forming an orientation control layer on a nonmagnetic substrate which controls the orientation properties of a layer immediately above; and
a step for forming a perpendicular magnetic layer by a sputtering process, in which the axis of easy magnetization is mainly oriented perpendicularly with respect to the nonmagnetic substrate,
wherein in the step for forming a perpendicular magnetic layer,
at least a portion of the perpendicular magnetic layer is formed as a magnetic layer having Co as a major component and a granular structure which includes an oxide of at least one nonmagnetic metal selected from the group consisting of Cr, Si, Ta, Al, Ti, W and Mg,
a target for forming the perpendicular magnetic layer by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target higher than the proportion of oxygen contained in the perpendicular magnetic layer, and
a sputtering gas pressure at the time of forming the perpendicular magnetic layer is not more than 1 Pa.

A second aspect of the present invention is a method for manufacturing a magnetic recording medium according to the above first aspect characterized in that in the step for forming a perpendicular magnetic layer, the proportion of oxygen contained in the target is within a range from 1.2 to 4 times as high as the proportion of oxygen contained in the perpendicular magnetic layer.

A third aspect of the present invention is a method for manufacturing a magnetic recording medium according to the above first or second aspect characterized in that in the step for forming a perpendicular magnetic layer, the content of oxides contained in the perpendicular magnetic layer is within a range from 3 to 18 mol % with respect to the total molar amount of elements constituting magnetic particles of the perpendicular magnetic layer.

A fourth aspect of the present invention is a method for manufacturing a magnetic recording medium according to any one of the above first to third aspects characterized in that in the step for forming a perpendicular magnetic layer, magnetic particles of the perpendicular magnetic layer are formed as columnar crystals continuous from particles which constitute the orientation control layer.

A fifth aspect of the present invention is a magnetic recording medium manufactured by the method for manufacturing a magnetic recording medium of any one of the above first to fourth aspects.

A sixth aspect of the present invention is a magnetic recording and reproducing apparatus characterized by having a combination of the magnetic recording medium of the above fifth aspect, a driving section for driving the magnetic recording medium in the recording direction, a magnetic head composed of a recording section and a reproducing section, a device for moving the magnetic head relative to the magnetic recording medium, and a recording/reproducing signal processing device for supplying input signals to the magnetic head and reproducing output signals from the magnetic head.

According to the method for manufacturing a magnetic recording medium of the present invention, the method is such that at least a portion of the perpendicular magnetic layer is formed as a magnetic layer having Co as a major component and a granular structure which includes an oxide of at least one nonmagnetic metal selected from the group consisting of Cr, Si, Ta, Al, Ti, W and Mg, a target for forming the perpendicular magnetic layer by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target higher than the proportion of oxygen contained in the perpendicular magnetic layer, and a sputtering gas pressure at the time of forming the perpendicular magnetic layer is not more than 1 Pa. Therefore, even under a low gas pressure condition, a perpendicular magnetic layer can be formed while stabilizing the oxygen concentration contained in the film by strictly controlling the film-forming conditions. Due to this configuration, it is possible to form a perpendicular magnetic layer having a high density and hardness and also exhibiting excellent electromagnetic conversion characteristics. Therefore, it becomes possible to manufacture a magnetic recording medium which is excellent in terms of all the recording and reproduction characteristics, the thermal fluctuation characteristics, and the scratch resistance.

In addition, according to the magnetic recording medium of the present invention, since it is a magnetic recording medium obtained by the manufacturing method of the present invention as described above, the magnetic recording medium is excellent in terms of all the recording and reproduction characteristics, the resistance to thermal fluctuation and the scratch resistance, and can also be applied for high density recording.

In addition, since the magnetic recording and reproducing apparatus of the present invention includes the above-mentioned magnetic recording medium of the present invention, it is possible to attain a magnetic recording and reproducing apparatus with which an excellent recording density is achieved.

DETAILED DESCRIPTION OF THE INVENTION

One embodiment of a method for manufacturing a magnetic recording medium, a magnetic recording medium, and a magnetic recording and reproducing apparatus according to the present invention will be described below by referring to the attached drawings where appropriate.

Figure 1:
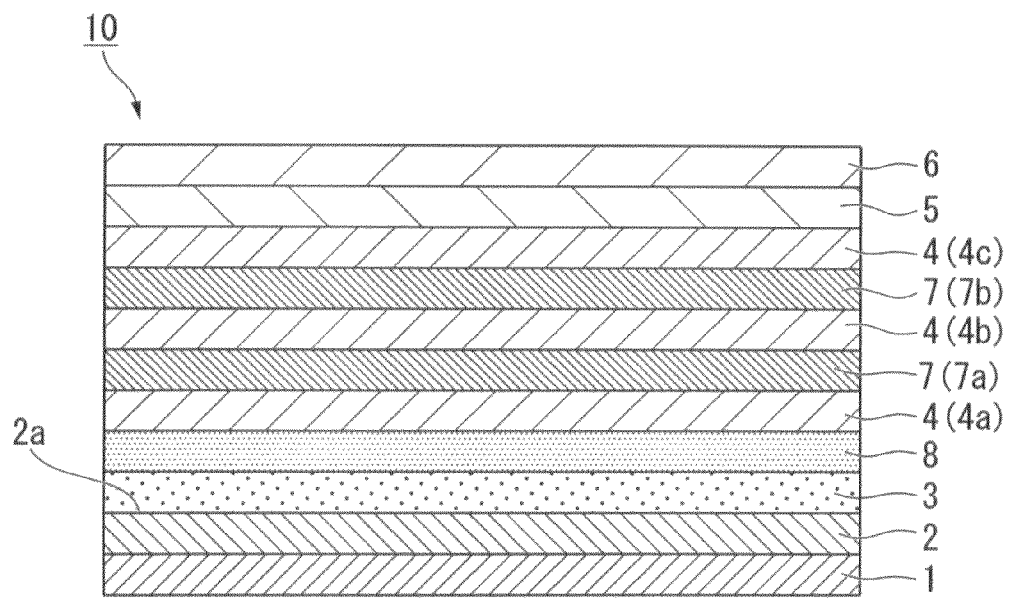
FIG. 1 is a drawing for schematically describing a method for manufacturing a magnetic recording medium and a magnetic recording medium according to the present invention. The drawing is a cross sectional view showing the structure of a magnetic recording medium in which the respective layers are formed on a nonmagnetic substrate.
Figure 2:
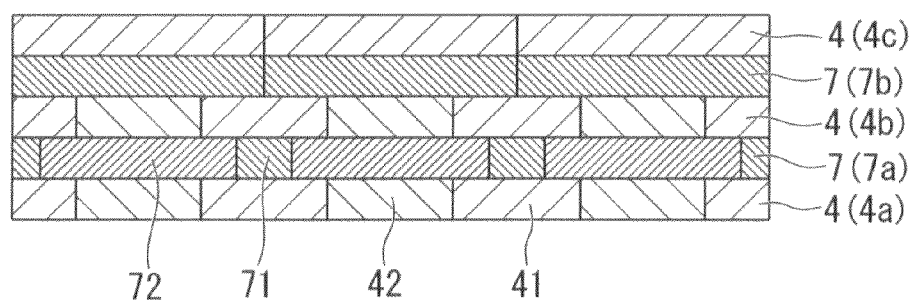
FIG. 2 is a drawing for schematically describing a method for manufacturing a magnetic recording medium and a magnetic recording medium according to the present invention. The drawing is a partial cross sectional view showing the structures of a perpendicular magnetic layer and nonmagnetic layer which constitute a main part of the magnetic recording medium shown in FIG. 1.
Figure 3:
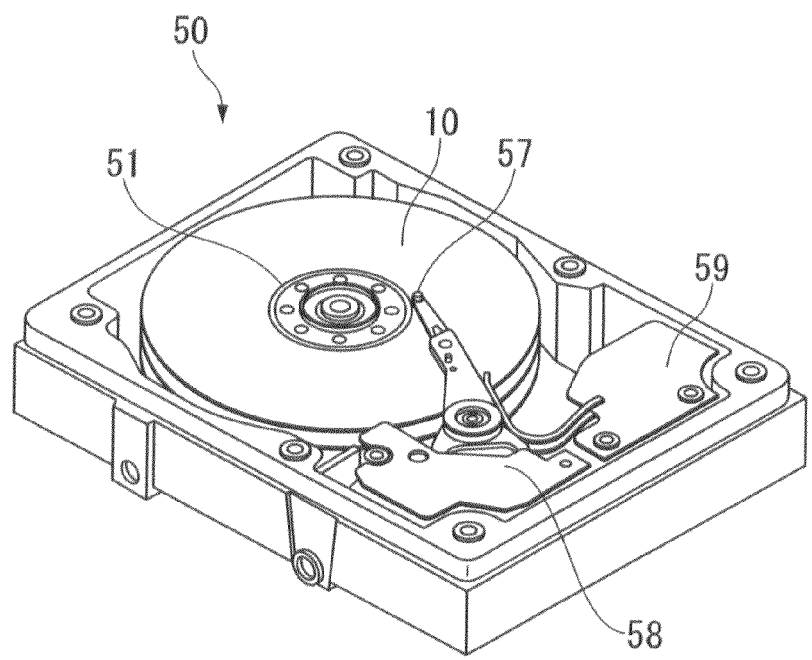
FIG. 3 is a drawing for schematically describing a magnetic recording and reproducing apparatus that includes the magnetic recording medium according to the present invention.
Figure 4C:
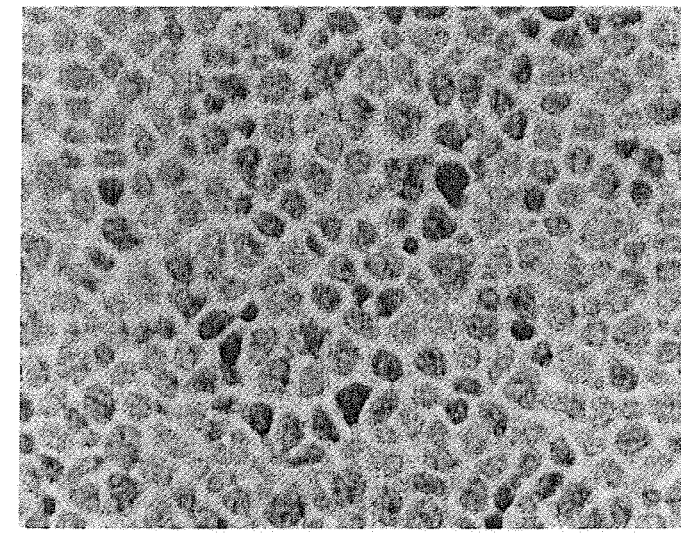
FIG. 4C is a diagram for schematically describing Examples and Comparative Examples regarding the method for manufacturing a magnetic recording medium and the magnetic recording medium according to the present invention. The diagram is an electron micrograph by which the organization of a perpendicular magnetic layer having a granular structure can be observed.
Figure 4B:
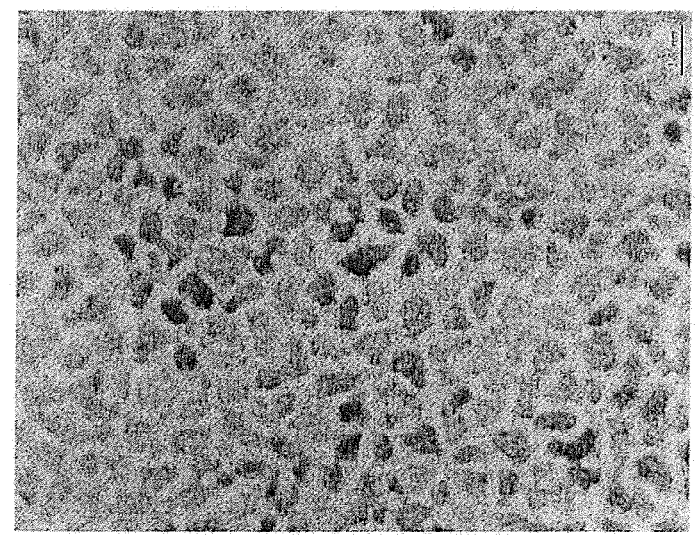
FIG. 4B is a diagram for schematically describing Examples and Comparative Examples regarding the method for manufacturing a magnetic recording medium and the magnetic recording medium according to the present invention. The diagram is an electron micrograph by which the organization of a perpendicular magnetic layer having a granular structure can be observed.
Figure 4A:
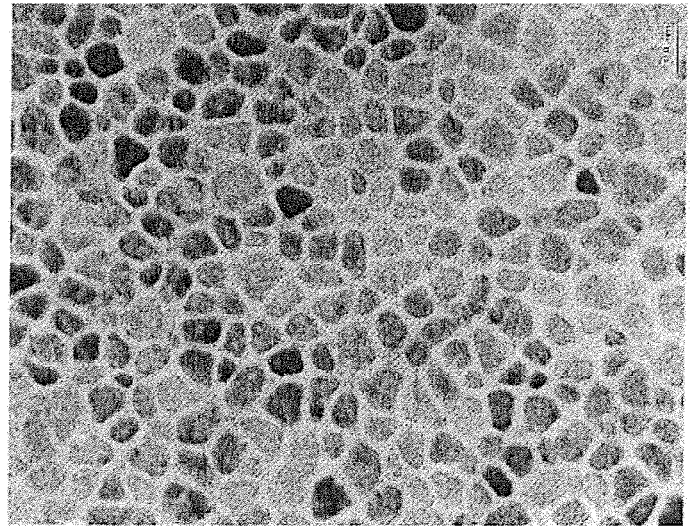
FIG. 4A is a diagram for schematically describing Examples and Comparative Examples regarding the method for manufacturing a magnetic recording medium and the magnetic recording medium according to the present invention. The diagram is an electron micrograph by which the organization of a perpendicular magnetic layer having a granular structure can be observed.
Figure 5:
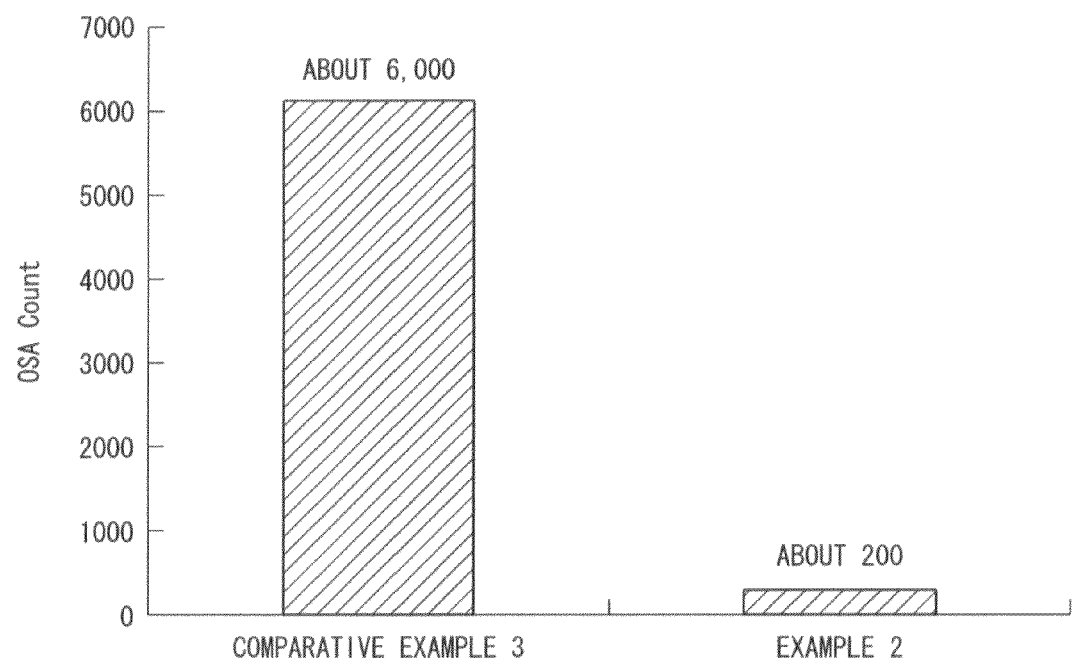
FIG. 5 is a diagram for schematically describing Examples and Comparative Examples regarding the method for manufacturing a magnetic recording medium and the magnetic recording medium according to the present invention. The diagram is a graph showing the number of scratches occurred on the surface of the magnetic recording medium.

FIGS. 1 and 2 are cross sectional views that schematically describing a magnetic recording medium of the present embodiment, and FIG. 3 is a drawing for schematically describing an example of a magnetic recording and reproducing apparatus that includes the magnetic recording medium of the present embodiment. In addition, FIGS. 4 and 5 are photographs and diagrams that schematically describing a working Example of a magnetic recording medium according to the present invention. It should be noted that the drawings referred to in the following descriptions are drawings for simply explaining the method for manufacturing a magnetic recording medium, the magnetic recording medium and the magnetic recording and reproducing apparatus, and thus the dimensions of each component in the drawings, such as the size and thickness thereof, are different from the dimensions of the actual magnetic recording medium or the like.

A method for manufacturing a magnetic recording medium according to the present embodiment is a method including:

a step for at least forming an orientation control layer 3 on a nonmagnetic substrate 1 which controls the orientation properties of a layer immediately above; and a step for forming a perpendicular magnetic layer 4 by a sputtering process in which the axis of easy magnetization is mainly oriented perpendicularly with respect to the nonmagnetic substrate 1, wherein in the step for forming a perpendicular magnetic layer 4, at least a portion of the perpendicular magnetic layer 4 is formed as a magnetic layer having a granular structure that contains Co as a major component and also contains an oxide of at least one nonmagnetic metal selected from the group consisting of Cr, Si, Ta, Al, Ti, W and Mg, a target for forming the perpendicular magnetic layer 4 by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target higher than the proportion of oxygen contained in the perpendicular magnetic layer 4, and a sputtering gas pressure at the time of forming the perpendicular magnetic layer is set to 1 Pa or less.

[Magnetic Recording Medium]

A magnetic recording medium 10 obtained by the manufacturing method of the present embodiment will be described in more detail using schematic cross sectional views shown in FIGS. 1 and 2 and an example of a magnetic recording and reproducing apparatus 50 shown in FIG. 3. Each FIGS. 1 and 2 is a longitudinal sectional view showing a layer structure of the magnetic recording medium 10 which is obtained by forming each layer on the nonmagnetic substrate 1.

Further, the magnetic recording medium 10 of the present embodiment includes a magnetic recording pattern (not shown) which is magnetically separated and is configured into a substantially doughnut shaped plate when seen in plan view (refer to the component indicated by the reference numeral 10 in the magnetic recording and reproducing apparatus 50 shown in FIG. 3).

The magnetic recording medium 10 of the present embodiment 10 is configured by sequentially forming each of a soft magnetic underlayer 2, an orientation control layer 3, a perpendicular magnetic layer 4, a protective layer 5 and a lubricating layer 6 on top of the nonmagnetic substrate 1, and the soft magnetic underlayer 2 and the orientation control layer 3 among these layers constitute an underlying layer. In addition, an example of the perpendicular magnetic layer 4 described in the present embodiment includes 3 layers from the nonmagnetic substrate 1 side; i.e., a lower magnetic layer 4a, an intermediate magnetic layer 4b and an upper magnetic layer 4c, in this order, and nonmagnetic layers 7 (i.e., 7a and 7b) are each provided between the lower magnetic layer 4a and the intermediate magnetic layer 4b and between the intermediate magnetic layer 4b and the upper magnetic layer 4c. Further, in the perpendicular magnetic layer 4 described in the present embodiment, magnetic particles 42 that constitute each of the lower magnetic layer 4a, the intermediate magnetic layer 4b and the upper magnetic layer 4c are formed as a columnar crystal continuous from the lower magnetic layer 4a to the upper magnetic layer 4c.

Furthermore, the magnetic recording medium 10 includes the perpendicular magnetic layer 4 which is magnetized in a direction perpendicular to the nonmagnetic substrate 1 and writing and reading the information signals to and from a magnetic recording pattern (not shown) are conducted by a magnetic head 57 (refer to the magnetic recording and reproducing apparatus 50 shown in FIG. 3) provided with a reading head and a writing head.

The nonmagnetic substrate 1 may be a metallic substrate formed from a metallic material such as aluminum or an aluminum alloy, or a non-metallic substrate formed from a non-metallic material such as glass, ceramic, silicon, silicon carbide, or carbon.

A glass substrate used for the nonmagnetic substrate 1 may be formed from amorphous glass or glass ceramic. Of these, amorphous glass may be general-purpose glass, such as soda-lime glass, or aluminosilicate glass. Further, as glass ceramic, lithium-based glass ceramic can be used. Moreover, as a ceramic substrate, a general-purpose sintered body predominantly containing aluminum oxide, aluminum nitride, silicon nitride or the like; or a fiber-reinforced material thereof or the like can be used.

Furthermore, as the nonmagnetic substrate 1, it is also possible to use the metallic or non-metallic substrates as described above in which a NiP layer or a NiP alloy layer is formed on the substrate surface through a plating or sputtering process.

The average surface roughness (Ra) of the nonmagnetic substrate 1 is preferably 2 nm (20 Å) or less, and more preferably 1 nm or less, since the flying height of a magnetic head can be reduced, which is suitable for achieving high recording density.

In addition, the microwaviness (Wa) of the surface of the nonmagnetic substrate 1 is preferably 0.3 nm or less, more preferably 0.25 nm or less, so as to suitably attain recording at high recording density under a reduced flying height of the magnetic head as described above.

Further, from the viewpoint of flying stability of the magnetic head, the average surface roughness (Ra) of at least one of an edge grinding portion of a chamfer section of the end surface and a side surface portion of the nonmagnetic substrate 1 is preferably 10 nm or less, more preferably 9.5 nm or less.

The microwaviness (Wa) described here in the present embodiment can be obtained as an average surface roughness as measured within a measurement range of 80 μm by use of, for example, a surface roughness measurement apparatus (P-1 type, a product of KLM-Tencor, USA).

It is preferable to provide an adhesive layer (not shown) between the nonmagnetic substrate 1 and the soft magnetic underlayer 2 described later. When the nonmagnetic substrate 1 and the soft magnetic underlayer 2 having Co or Fe as its major component are in a direct contact, corrosion may occur due to the adverse effects caused by the adsorption gas or water on the surface of the nonmagnetic substrate 1 or the diffusion of substrate components. In order to suppress such corrosion, it is preferable to provide an adhesive layer on top of the nonmagnetic substrate 1.

In terms of the material that constitutes such an adhesive layer, for example, Cr, a Cr alloy, Ti and a Ti alloy can be appropriately selected, and the thickness of the adhesive layer is preferably at least 30 Å.

The soft magnetic underlayer 2 is a film provided for increasing the level of magnetic flux component in the direction perpendicular to the nonmagnetic substrate 1 which is generated from the magnetic head and for firmly fixing the magnetization direction of the perpendicular magnetic layer 4 in which information is recorded in the direction perpendicular to the nonmagnetic substrate 1. The effects achieved by the provision of such soft magnetic undercoat layer 2 become increasingly apparent particularly when a single magnetic pole head for perpendicular recording is employed as a magnetic head for magnetic recording and reproduction.

The soft magnetic undercoat layer 2 is constituted from a soft magnetic material. For example, a material containing Fe, Ni, and Co can be used. More specifically, examples of such soft magnetic materials include CoFe alloys (such as CoFeTaZr and CoFeZrNb), FeCo-based alloys (such as FeCo and FeCoV), FeNi-based alloys (such as FeNi, FeNiMo, FeNiCr and FeNiSi), FeAl-based alloys (such as FeAl, FeAlSi, FeAlSiCr, FeAlSiTiRu and FeAlO), FeCr-based alloys (such as FeCr, FeCrTi and FeCrCu), FeTa-based alloys (such as FeTa, FeTaC, and FeTaN), FeMg-based alloys (such as FeMgO), FeZr-based alloys (such as FeZrN), FeC-based alloys, FeN-based alloys, FeSi-based alloys, FeP-based alloys, FeNb-based alloys, FeHf-based alloys and FeB-based alloys.

Further, as a material for constituting the soft magnetic underlayer 2, it is also possible to use either a material containing Fe in an amount of at least 60 at % (atomic %) and having a fine-crystalline structure of, for example, FeAlO, FeMgO, FeTaN, FeZrN or the like, or a material having a granular structure in which fine crystal particles are dispersed in a matrix.

Alternatively, as a material for constituting the soft magnetic underlayer 2, other than the materials described above, it is possible to use, for example, a Co alloy containing Co in an amount of at least 80 at % and at least one element selected from among Zr, Nb, Ta, Cr, Mo, and the like, and having an amorphous structure. Preferred examples of the Co alloy include CoZr-based alloys, CoZrNb-based alloys, CoZrTa-based alloys, CoZrCr-based alloys and CoZrMo-based alloys.

The coercive force (Hc) of the soft magnetic underlayer 2 is preferably 100 (Oe) or less, and more preferably 20 (Oe) or less. Here, the unit for the coercive force (Hc) is defined as 1 (Oe)=79 (A/m). When the coercive force (Hc) exceeds 100 (Oe), it is not preferable since soft magnetic characteristics become inadequate, and the reproduction waveform changes from so-called rectangular waves to waveforms having distorted shapes.

The saturation magnetic flux density (Bs) of the soft magnetic underlayer 2 is preferably not less than 0.6 T, and more preferably not less than 1 T. When the saturation magnetic flux density is less than 0.6 T, it is not preferable since the reproduction waveform changes from so-called rectangular waves to waveforms having distorted shapes.

Further, in the magnetic recording medium 10 in the present embodiment, the product of the saturation magnetic flux density Bs (T) of the soft magnetic underlayer 2 and the layer thickness t (nm) of the soft magnetic underlayer 2 {i.e., Bs·t(T·nm)} is preferably at least 15 (T·nm), and more preferably at least 25 (T·nm). When the value of Bs·t is less than 15 (T·nm), it is not preferable since reproduction waveforms began to exhibit distortions and so-called overwrite (OW) characteristics (i.e., recording characteristics) deteriorate.

In addition, in the present embodiment, although specific illustrations in the diagrams will be omitted, it is more preferable that the soft magnetic underlayer 2 be constituted from two layers of soft magnetic films, and that a ruthenium (Ru) layer be provided between these two soft magnetic layers. By adjusting the film thickness of the Ru layer within a predetermined range from 0.4 to 1.0 nm or from 1.6 to 2.6 nm, the two soft magnetic films become to form an AFC structure. By making the soft magnetic underlayer 2 to have an AFC structure as described above, it becomes possible to suppress so-called spike noise.

The surface 2a of the soft magnetic underlayer 2 (that is, the surface facing the orientation control layer 3 described later) is preferably configured so that the above-mentioned material constituting the soft magnetic underlayer 2 is partially or completely oxidized. For example, at the surface 2a of the soft magnetic underlayer 2 and in the vicinity thereof, it is preferable either that the material constituting the soft magnetic underlayer 2 be partially oxidized, or an oxide of the material be formed and arranged. Since magnetic fluctuation on the surface 2a of the soft magnetic underlayer 2 can be prevented through such oxidation, the level of noise attributed to the magnetic fluctuation can be reduced, thereby improving recording and reproduction characteristics of the magnetic recording medium.

The orientation control layer 3 is formed on the soft magnetic underlayer 2, and thus crystal particles of the perpendicular magnetic layer 4 described later can be micronized, thereby improving recording and reproduction characteristics.

No particular limitation is imposed on the material employed for forming the orientation control layer 3. However, for example, the orientation control layer 3 is preferably formed from a material having an hcp structure, an fcc structure or an amorphous structure. It is particularly preferable that the orientation control layer 3 be constituted from a Ru-based alloy, a Ni-based alloy, a Co-based alloy, a Pt-based alloy or a Cu-based alloy, and these alloys may also be made into a multilayer structure for use. For example, from the nonmagnetic substrate 1 side, it is preferable to adopt a configuration of multilayer structures, where appropriate, such as a multilayer structure composed of a Ni-based alloy and a Ru-based alloy, a multilayer structure composed of a Co-based alloy and a Ru-based alloy and a multilayer structure composed of a Pt-based alloy and a Ru-based alloy.

For example, when a Ni-based alloy is used as a material for the orientation control layer 3, it is preferable that the material is at least one alloy selected from a NiW alloy, a NiTa alloy, a NiNb alloy, a NiTi alloy, a NiZr alloy, a NiMn alloy and NiFe alloy which contains 33 to 96 at % of Ni. Alternatively, the material may be a nonmagnetic material which contains 33 to 96 at % of Ni and also contains one or more elements among Sc, Y, Ti, Zr, Hf, Nb, Ta and C. In this case, it is preferable that the Ni content be within a range from 33 at % to 96 at % since the orientation control layer can retain the effects thereof while not exhibiting magnetic properties in this range.

In the magnetic recording medium 10 of the present embodiment, when the orientation control layer 3 is configured so as to have a 2 layer structure composed of a NiW alloy layer (lower layer) and a Ru layer (upper layer), it is preferable that the layer thickness be about 6 nm for the NiW alloy layer and about 15 nm for the Ru layer, respectively. When the thickness of the orientation control layer 3 falls within the above-mentioned range, the distance between a magnetic head and the soft magnetic underlayer 2 can be reduced during recording of data. In addition, it is more preferable that the orientation control layer 3 be configured as thin as possible since recording and reproduction characteristics can be improved without lowering resolution of a reproduced signal.

Further, since the surface profile of the orientation control layer 3 affects the perpendicular orientation properties and surface profile of the perpendicular magnetic layer 4 as described above, it is preferable to form the orientation control layer 3 with an optimal surface profile as well as an adequate level of surface roughness.

Moreover, the orientation control layer 3 may have a structure in which metallic particles are dispersed in an oxide, a metallic nitride or a metallic carbide. Such structures can be prepared by employing an alloy material containing an oxide, a metallic nitride or a metallic carbide for the orientation control layer 3. For example, oxides such as $SiO_2$, $Al_2O_3$, $Ta_2O_5$, $Cr_2O_3$, MgO, $Y_2O_3$ and $TiO_2$; metallic nitrides such as AlN, $Si_3N_4$, TaN and CrN; and metallic carbides such as TaC, BC and SiC can be used in the orientation control layer 3. Examples of such structures include NiTa—$SiO_2$, RuCo—$Ta_2O_5$, Ru—$SiO_2$, Pt—$Si_3N_4$ and Pd—TaC.

The total content of oxides, metallic nitrides and metallic carbides within the orientation control layer 3 is preferably not less than 1 mol % and not more than 12 mol %, with respect to the entire alloy. For example, in the case of a Ru—$SiO_2$ structure as described above, it is preferable to contain the oxide within a range from 99Ru-1($SiO_2$) to 88Ru-12($SiO_2$). When the total content of oxides, metallic nitrides and metallic carbides within the orientation control layer 3 exceeds the above-mentioned range, oxides, metallic nitrides and metallic carbides remain among metallic particles, and thus it is not preferable since it not only impairs the crystallinity and orientation properties of metallic particles but may also impair the crystallinity and orientation properties of the perpendicular magnetic layer 4 which will be formed on top of the orientation control layer 3. On the other hand, when the total content of oxides, metallic nitrides and metallic carbides within the orientation control layer 3 is less than the above-mentioned range, it is not preferable since the effects due to the addition of oxides, metallic nitrides and metallic carbides are not achieved.

It is preferable to provide a nonmagnetic base layer 8 between the orientation control layer 3 and the perpendicular magnetic layer 4 described later. Disorders tend to appear in the crystals grown within a portion of the perpendicular magnetic layer 4 which is initially formed immediately on top of the orientation control layer 3, which cause noise. By replacing such an initially formed portion of the perpendicular magnetic layer 4 in which disorders in the crystal growth occurred with the nonmagnetic base layer 8, it is possible to suppress the occurrence of noise.

It is preferable that the nonmagnetic base layer 8 have Co as the major component thereof and be formed from a material containing an oxide. Further, as the oxide constituting the nonmagnetic base layer 8, oxides of Cr, Si, Ta, Al, Ti, Mg and Co are preferable, and $TiO_2$, $Cr_2O_3$ and $SiO_2$ are particularly suitable. Moreover, it is preferable that the oxide constituting the nonmagnetic base layer 8 be a composite oxide formed by the addition of two or more oxides, and combination of $Cr_2O_3+SiO_2$, $Cr_2O_3+TiO_2$ and $Cr_2O_3+SiO_2+TiO_2$ are particularly suitable.

In addition, for the nonmagnetic base layer 8, it is preferable to use CoCr—$SiO_2$, CoCr—$TiO_2$, CoCr—$Cr_2O_3$—$SiO_2$, CoCr—$TiO_2$—$Cr_2O_3$ and CoCr—$Cr_2O_3$—$TiO_2$—$SiO_2$, and it is also favorable to include Pt in view of satisfactory crystal growth. Further, the content of Cr within the above-mentioned material is preferably not less than 25 at % (atomic %) and not less than 50 at %. Furthermore, the content of oxides within the above-mentioned material is preferably not less than 3 mol % and not more than 18 mol %, with respect to the total molar amount which is calculated by assuming the alloys constituting magnetic particles, for example, the alloys of Co, Cr, Pt or the like as one compound.

It is preferable that the thickness of the nonmagnetic base layer 8 be not less than 0.2 nm and not more than 3 nm. When the thickness of the nonmagnetic base layer 8 exceeds 3 nm, it is not preferable since the levels of Hc and Hn reduce.

The perpendicular magnetic layer 4 is formed on top of the nonmagnetic base layer 8 which is provided on top of the nonmagnetic substrate 1 where appropriate, and has a structure that contains 3 layers i.e., a lower magnetic layer 4a, an intermediate magnetic layer 4b and an upper magnetic layer 4c, in this order from the nonmagnetic substrate 1 side. Further, in examples shown in FIGS. 1 and 2, the perpendicular magnetic layer 4 has nonmagnetic layers 7 (i.e., 7a and 7b) which are provided between the lower magnetic layer 4a and the intermediate magnetic layer 4b and between the intermediate magnetic layer 4b and the upper magnetic layer 4c, respectively.

The lower magnetic layer 4a that constitutes the perpendicular magnetic layer 4 is a magnetic layer formed by a sputtering process and having a granular structure which contains Co as the major component thereof and also contains an oxide. In addition, the lower magnetic layer 4a of the present embodiment is composed of a material containing an oxide 41. Specific examples of the oxide 41 include oxides of Cr, Si, Ta, Al, Ti, W and Mg, and it is favorable to use $TiO_2$, $Cr_2O_3$ and $SiO_2$. Moreover, it is preferable that the lower magnetic layer 4a contain a composite oxide formed by the addition of two or more oxides as described above, and combination of $Cr_2O_3+SiO_2$, $Cr_2O_3+TiO_2$ and $Cr_2O_3+SiO_2+TiO_2$ are particularly suitable.

The lower magnetic layer 4a (perpendicular magnetic layer 4) is a magnetic layer having a so-called granular structure in which magnetic particles 42 (crystal particles exhibiting magnetic properties) are dispersed within the layer. In the examples shown in FIGS. 1 and 2, the magnetic particles 42 of the lower magnetic layer 4a formed as a continuous columnar crystal from particles constituting the orientation control layer 3 via the nonmagnetic base layer 8.

In the present embodiment, when the perpendicular magnetic layer 4 is configured so as to have a three layer structure as shown in FIG. 2, it is preferable that the magnetic particles that constitute each of the lower magnetic layer 4a, the intermediate magnetic layer 4b and the upper magnetic layer 4c be formed as a crystal having a columnar structure continuous from the lower magnetic layer 4a to the upper magnetic layer 4c so as to vertically penetrate through these layers. By employing such a structure, the orientation and crystallinity of the magnetic particles 42 in the perpendicular magnetic layer 4 become satisfactory, and as a result, the magnetic recording medium 10 having a signal to noise (S/N) ratio suitable for high density recording can be obtained. Note that in the example shown in FIG. 2, nonmagnetic layers 7 (i.e., 7a and 7b) are provided between each of the lower magnetic layer 4a, intermediate magnetic layer 4b and upper magnetic layer 4c which constitute the perpendicular magnetic layer 4. In addition, the magnetic particles 42 of the perpendicular magnetic layer 4 prepared into a form of columnar structure is formed as a crystal having a columnar structure continuous from the lower magnetic layer 4a to the upper magnetic layer 4c so as to vertically penetrate through these layers via the magnetic particles (refer to the component indicated by the reference numeral 72 in FIG. 2) contained in the nonmagnetic layer 7.

In order to obtain the lower magnetic layer 4a (perpendicular magnetic layer 4) having a granular structure as described above, the amount of the contained oxide 41, and the target compositional ratio and film forming conditions employed at the time of film formation by the sputtering process become important factors.

The content of oxides 41 contained within the lower magnetic layer 4a (perpendicular magnetic layer 4) is preferably not less than 3 mol % and not more than 18 mol %, with respect to the total molar amount which is calculated by assuming the alloys constituting the magnetic particles 42, for example, the alloys of Co, Cr, Pt or the like as one compound.

Further, it is more preferable that the content of oxides 41 contained within the lower magnetic layer 4a be not less than 6 mol % and not more than 13 mol %, with respect to the total molar amount which is calculated by assuming the above-mentioned alloys as one compound.

The above-mentioned range is preferable for the content of oxides 41 contained within the lower magnetic layer 4a (perpendicular magnetic layer 4) because when the content is within this range, oxides are precipitated in the periphery of magnetic particles when a magnetic layer is formed, and thus it is possible to accelerate the isolation and micronization of the magnetic particles 42 (refer to FIG. 2). When the content of oxides exceed the above-mentioned range, oxides remain among magnetic particles to impair the orientation properties and crystallinity of magnetic particles, and oxides are also precipitated both on top of and under the magnetic particles. As a result, magnetic particles are not made into a continuous columnar structure continuous from the lower magnetic layer 4a to the upper magnetic layer 4c so as to penetrate these layers, and thus this case is not preferable. On the other hand, when the content of oxides is less than the above-mentioned range, the levels of separation and micronization of magnetic particles become inadequate. As a result, noise increases during recording and reproduction of data, and signal to noise (S/N) ratio suitable for high density recording cannot be obtained, and thus this case is also not preferable.

The content of Cr in the lower magnetic layer 4a is preferably not less than 4 at % and not more than 19 at %, and more preferably not less than 6 at % and not more than 17 at %. When the Cr content in the lower magnetic layer 4a is within the above-mentioned range, the magnetic anisotropy constant (Ku) of magnetic particles does not reduce too much and a high level of magnetization can be maintained. As a result, recording and reproduction characteristics suitable for high density recording and an adequate level of thermal fluctuation characteristics can be attained. When the Cr content in the lower magnetic layer 4a exceeds the above-mentioned range, it is not preferable since thermal fluctuation characteristics are impaired due to the reduction of the magnetic anisotropy constant (Ku) of magnetic particles, and the crystallinity and orientation properties of magnetic particles are also impaired, as a result of which recording and reproduction characteristics are impaired. Further, when the Cr content in the lower magnetic layer 4a is less than the above-mentioned range, it is not preferable since the level of perpendicular coercive force becomes too high due to the high magnetic anisotropy constant (Ku) of magnetic particles, and the writing by the magnetic head does not take place in a satisfactory manner during the recording of data, as a result of which recording characteristics (OW characteristics) become unsuitable for high density recording.

The content of Pt in the lower magnetic layer 4a is preferably not less than 8 at % and not more than 20 at %. When the Pt content in the lower magnetic layer 4a is less than 8 at %, it is not preferable since the magnetic anisotropy constant (Ku) required for the perpendicular magnetic layer becomes low. On the other hand, when the Pt content in the lower magnetic layer 4a exceeds 20 at %, it is not preferable since lamination defects occur inside the magnetic particles, as a result of which the magnetic anisotropy constant (Ku) becomes low. In the present embodiment, it is preferable that the Pt content in the lower magnetic layer 4a be within the above-mentioned range in order to attain thermal fluctuation characteristics and recording and reproduction characteristics suitable for high density recording.

Further, when the Pt content in the lower magnetic layer 4a exceeds the above-mentioned range, it is not preferable since an fcc-structure layer is formed in the magnetic particles, which may impair the crystallinity and orientation properties thereof. On the other hand, when the Pt content in the lower magnetic layer 4a is less than the above-mentioned range, it is not preferable since a magnetic anisotropy constant (Ku) required for achieving thermal fluctuation characteristics that are suitable for high density recording cannot be attained.

Further, the lower magnetic layer 4a can include at least one or more elements selected from amongst B, Ta, Mo, Cu, Nd, W, Nb, Sm, Tb, Ru and Re, in addition to the oxides of Co, Cr or Pt. By including the above-mentioned elements, it is possible to either promote the micronization of magnetic particles or improve the crystallinity and orientation properties, thereby achieving more suitable levels of recording and reproduction characteristics and thermal fluctuation characteristics for high density recording.

In addition, the total content of the above-mentioned element in the lower magnetic layer 4a is preferably not more than 8 at %. When the total content of the above-mentioned element exceeds 8 at %, it is not preferable since another phase other than the hcp phase is formed in the magnetic particles to disturb the crystallinity and orientation properties of the magnetic particles, as a result of which recording and reproduction characteristics and thermal fluctuation characteristics suitable for high density recording cannot be obtained.

Further, with respect to the materials most suited for the lower magnetic layer 4a (perpendicular magnetic layer 4), examples thereof include (Co14Cr18Pt)90-(SiO$_2$)10 [i.e., 90 mol % (molar concentration) of magnetic particles containing 14 at % of Cr, 18 at % of Pt and the remainder being Co, which is calculated by assuming the magnetic particles as one compound, and 10 mol % of an oxide composition formed of SiO$_2$], (Co10Cr16Pt)92-(SiO$_2$)8, and (Co8Cr14Pt4Nb)94-(Cr$_2$O$_3$)6, in addition to (CoCrPt)—(Ta$_2$O$_5$), (CoCrPt)—(Cr$_2$O$_3$)—(TiO$_2$), (CoCrPt)—(Cr$_2$O$_3$)—(SiO$_2$), (CoCrPt)—(Cr$_2$O$_3$)—(SiO$_2$)—(TiO$_2$), (CoCrPtMo)—(TiO), (CoCrPtW)—(TiO$_2$), (CoCrPtB)—(Al$_2$O$_3$), (CoCrPtTaNd)—(MgO), (CoCrPtBCu)—(Y$_2$O$_3$), and (CoCrPtRu)—(SiO$_2$).

The intermediate magnetic layer 4b is provided on the lower magnetic layer 4a via the nonmagnetic layer 7a (7) described later, and as the lower magnetic layer 4a, includes Co as the major component thereof and is composed of a material containing the oxide 41. Preferred examples of the oxide 41 contained in the intermediate magnetic layer 4b include oxides of Cr, Si, Ta, Al, Ti, Mg, Co or the like, and TiO$_2$, Cr$_2$O$_3$ and SiO$_2$ are particularly suitable. Moreover, it is preferable that the oxide 41 contained in the intermediate magnetic layer 4b be a composite oxide formed by the addition of two or more oxides, and combination of Cr$_2$O$_3$+SiO$_2$, Cr$_2$O$_3$+TiO$_2$ and Cr$_2$O$_3$+SiO$_2$+TiO$_2$ are particularly suitable.

In the magnetic recording medium according to the present invention, as indicated by the example shown in FIG. 2, the perpendicular magnetic layer 4 can be made into a multilayer structure. In addition, a plurality of magnetic layers configured according to the present invention which have a granular structure that contains Co as the major component thereof can be provided in the perpendicular magnetic layer 4 prepared as the multilayer structure. For example, when the perpendicular magnetic layer 4 is configured so as to have a three layer structure constituted of the lower magnetic layer 4a, the intermediate magnetic layer 4b and the upper magnetic layer 4c, it is more preferable to make two of the layers, that is, the lower magnetic layer 4a and the intermediate magnetic layer 4b, as the magnetic layers having a configuration according to the present invention and to make the upper magnetic layer 4c as a magnetic layer that does not have a granular structure. By adopting such a composite structure, as indicated by the example shown in FIG. 2, the magnetic particles 42 form a columnar crystal in a continuous manner so as to vertically penetrate through the lower magnetic layer 4a, the intermediate magnetic layer 4b and the upper magnetic layer 4c. Due to this configuration, the orientation and crystallinity of the magnetic particles 42 in the perpendicular magnetic layer 4 become satisfactory, and as a result, the magnetic recording medium 10 having an S/N ratio suitable for high density recording can be obtained. In addition, by providing the upper magnetic layer 4c having a non-granular structure on top of the lower magnetic layer 4a and intermediate magnetic layer 4b having granular structures, it is possible to soften the transition between particles which is attributable to the granular particles between the bits following the recording of signals on the magnetic recording medium by the magnetic head. Due to this configuration, the transition width between the bits in the magnetic recording medium can be reduced, and it becomes possible to obtain a magnetic recording medium having an S/N ratio suitable for high density recording.

For the upper magnetic layer 4c, a material containing Pt in addition to Co and Cr may be used. In this case, the content of Pt in the upper magnetic layer 4c is preferably not less than 8 at % and not more than 20 at %. By setting the Pt content in the upper magnetic layer 4c within the above-mentioned range, an adequate level of coercive force suitable for high density recording can be attained, and a high level of reproduction output can also be maintained at the time of recording and reproducing data. As a result, the magnetic recording medium 10 having recording and reproduction characteristics and thermal fluctuation characteristics suitable for high density recording can be obtained. When the Pt content in the upper magnetic layer 4c exceeds the above-mentioned range, it is not preferable since an fcc-structure phase is formed within the magnetic layer, which may impair the crystallinity and orientation properties thereof. On the other hand, when the Pt content in the upper magnetic layer 4c is less than the above-mentioned range, it is not preferable since a magnetic anisotropy constant (Ku) required for achieving thermal fluctuation characteristics that are suitable for high density recording cannot be attained.

Further, the upper magnetic layer 4c can be configured so as to include at least one or more elements selected from amongst B, Ta, Mo, Cu, Nd, W, Nb, Sm, Tb, Ru, Re and Mn, in addition to Co, Cr or Pt. Inclusion of the above-mentioned elements in the upper magnetic layer 4c enables either a promotion of the micronization of magnetic particles or improvements in the crystallinity and orientation properties, and thus the magnetic recording medium 10 exhibiting more suitable levels of recording and reproduction characteristics and thermal fluctuation characteristics for high density recording can be obtained.

In addition, the total content of the above-mentioned element in the upper magnetic layer 4c is preferably not more than 16 at %. When the total content of the above-mentioned element exceeds 16 at %, it is not preferable since another phase other than the hcp phase is formed in the magnetic particles to disturb the crystallinity and orientation properties of the magnetic particles, as a result of which recording and reproduction characteristics and thermal fluctuation characteristics suitable for high density recording cannot be obtained.

Examples of the materials that are particularly suited for the upper magnetic layer 4c include CoCrPt-based materials and CoCrPtB-based materials. When employing a CoCrPtB-based material for the upper magnetic layer 4c, the total content of Cr and B is preferably not less than 18 at % and not more than 28 at %.

More specifically, preferred examples of the materials suited for the upper magnetic layer 4c include, amongst the CoCrPt-based materials, a material having a composition of Co14-24Cr8-22Pt [i.e., a Cr content of 14 to 24 at %, a Pt content of 8 to 22 at % and the remainder being Co], and amongst the CoCrPtB-based materials, a material having a composition of Co10-24Cr8-22Pt0-16B [i.e., a Cr content of 10 to 24 at %, a Pt content of 8-22 at %, a B content of 0-16 at % and the remainder being Co]. Examples of the suitable materials also include those having different compositions, such as, amongst the CoCrPtTa-based materials, a material having a composition of Co10-24Cr8-22Pt1-5Ta [i.e., a Cr content of 10 to 24 at %, a Pt content of 8 to 22 at %, a Ta content of 1 to 5 at % and the remainder being Co], and amongst the CoCrPtTaB-based materials, a material having a composition of Co10-24Cr8-22Pt1-5Ta1-10B [i.e., a Cr content of 10 to 24 at %, a Pt content of 8 to 22 at %, a Ta content of 1 to 5 at %, a B content of 1 to 10 at % and the remainder being Co]. Furthermore, apart from the above-mentioned materials, examples of the suitable materials also include CoCrPtBNd-based materials, CoCrPtTaNd-based materials, CoCrPtNb-based materials, CoCrPtBW-based materials, CoCrPtMo-based materials, CoCrPtCuRu-based materials and CoCrPtRe-based materials.

The perpendicular coercive force (Hc) of the perpendicular magnetic layer 4 is preferably not less than 3,000 (Oe). When the perpendicular coercive force of the perpendicular magnetic layer 4 is less than 3,000 (Oe), the level of recording and reproduction characteristics, especially that of the frequency characteristics declines, and the level of thermal fluctuation characteristics also declines, which makes it unsuitable as a high density recording medium.

Further, the reverse magnetic domain nucleation field (-Hn) of the perpendicular magnetic layer 4 is preferably not less than 1,500 (Oe). When the reverse magnetic domain nucleation field (-Hn) of the perpendicular magnetic layer 4 is less than 1,500 (Oe), the resistance to thermal fluctuation declines, which is undesirable.

The average particle size of magnetic particles in the perpendicular magnetic layer 4 is preferably within a range from 3 to 12 nm. The average particle size can be determined, for example, through an image processing of the images of the perpendicular magnetic layer 4 observed by a transmission electron microscope (TEM).

The thickness of the perpendicular magnetic layer 4 as a whole is preferably within a range from 5 to 20 nm. When the thickness of the perpendicular magnetic layer 4 is less than the above-mentioned range, an adequate level of reproduction output cannot be attained, and the level of thermal fluctuation characteristics also declines. On the other hand, when the thickness of the perpendicular magnetic layer 4 exceeds the above-mentioned range, the size of magnetic particles in the perpendicular magnetic layer 4 become large, the level of noise during the recording and reproduction of data increases, and recording and reproduction characteristics represented by the S/N ratio and recording characteristics (OW characteristics) are deteriorated, which is undesirable.

It should be noted that the magnetic recording medium according to the present invention is not limited to the examples shown in FIGS. 1 and 2, and can also be configured from the perpendicular magnetic layer 4 constituted of 4 or more layers. For example, it may be configured so that a second intermediate magnetic layer (not shown) having a granular structure is provided, in addition to the lower magnetic layer 4a and the intermediate magnetic layer 4b, so as to form a three magnetic layers having a granular structure, and provide the upper magnetic layer 4c thereon which contains no oxides. In addition, by providing a second upper magnetic layer which does not contain oxides, it is also possible to adopt a configuration in which the upper magnetic layer is composed of two layers containing no oxides and is provided on top of the magnetic layer having a granular structure.

In the magnetic recording medium according to the present invention, it is preferable that the magnetic layer (the lower magnetic layer 4a and the intermediate magnetic layer 4b in the present example) positioned in the nonmagnetic substrate 1 side be a magnetic layer having a granular structure, and the magnetic layer (the upper magnetic layer 4c in the present example) positioned in the protective layer 5 side be a magnetic layer having a non-granular structure that contains no oxides. By adopting such a configuration, it becomes easier to control and adjust various properties of the magnetic recording medium, such as the thermal fluctuation characteristics, recording characteristics (OW characteristics) and S/N ratio.

It should be noted that in the magnetic recording medium according to the present invention, as shown in FIGS. 1 and 2, it is preferable to provide the nonmagnetic layer 7 (7a and 7b) between the respective magnetic layers constituting the perpendicular magnetic layer 4. By providing the nonmagnetic layer 7 between the respective magnetic layers constituting the perpendicular magnetic layer 4 with an adequate thickness, the magnetization reversal readily occurs in the individual films, and thus the level of dispersion of magnetization reversal in the entire magnetic particles can be reduced. Due to this configuration, the S/N ratio of the magnetic recording medium 10 can be improved even further.

It is preferable to use a material having an hcp structure for the nonmagnetic layer 7 provided between the respective magnetic layers that constitute the perpendicular magnetic layer 4. As such materials having an hcp structure, for example, it is preferable to use Ru, a Ru alloy, a CoCr alloy or a CoCrX1 alloy (wherein X1 is one or more elements selected from amongst Pt, Ta, Zr, Re, Ru, Cu, Nb, Ni, Mn, Ge, Si, O, N, W, Mo, Ti, V, Zr and B).

Further, when a CoCr-based alloy is used as the nonmagnetic layer 7, the Co content is preferably within a range from 30 to 80 at %. When the Co content in the nonmagnetic layer 7 is within the above range, it becomes possible to adjust the extent of coupling between the magnetic layers constituting the perpendicular magnetic layer 4.

In addition, when an alloy having an hcp structure is used as the nonmagnetic layer 7, apart from Ru, for example, alloys of Ru, Re, Ti, Y, Hf, Zn or the like can also be used.

Further, as a material for the nonmagnetic layer 7, a metallic element or alloy that has a different structure can also be used within a range so that the crystallinity and orientation properties of the magnetic layer above and below the nonmagnetic layer 7 are not impaired. Examples of such metallic elements or alloys include metallic elements such as Pd, Pt, Cu, Ag, Au, Ir, Mo, W, Ta, Nb, V, Bi, Sn, Si, Al, C, B and Cr, and alloys thereof. When a Cr alloy is used for the nonmagnetic layer 8, it is particularly suitable to use CrX2 (wherein X2 is one or more elements selected from amongst Ti, W, Mo, Nb, Ta, Si, Al, B, C and Zr), and the Cr content in this case is preferably not less than 60 at %.

Further, as the nonmagnetic layer 7, it is preferable to adopt a structure in which metallic particles of the above-mentioned alloy are dispersed among an oxide, metallic nitride or metallic carbide (refer to the components indicated by the reference numerals 71 and 72 in FIG. 2). Furthermore, it is more favorable if the metallic particles 72 have a continuous columnar structure so as to vertically penetrate through the nonmagnetic layer 7. When adopting such structures, it can be configured by employing an alloy material containing an oxide for the nonmagnetic layer 7. Examples of the oxides in this case include $SiO_2$, $Al_2O_3$, $Ta_2O_5$, $Cr_2O_3$, MgO, $Y_2O_3$ and $TiO_2$. In addition, examples of the metallic nitrides include MN, $Si_3N_4$, TaN and CrN, and examples of the metallic carbides include TaC, BC and SiC. Examples of the structures for constituting the nonmagnetic layer 7 as described above include CoCr—$SiO_2$, CoCr—$TiO_2$, CoCr—$Cr_2O_3$, CoCrPt—$Ta_2O_5$, Ru—$SiO_2$, Ru—$Si_3N_4$ and Pd—TaC.

The contents of oxide, metallic nitride and metallic carbide within the nonmagnetic layer 7 described above are preferably within a range so that the crystal growth and crystal orientation in the perpendicular magnetic layer 4 are not impaired. More specifically, the total content of oxide, metallic nitride and metallic carbide within the nonmagnetic layer 7 is preferably not less than 4 mol % and not less than 30 mol %, with respect to the entire alloy. When the total content of oxides, metallic nitrides and metallic carbides within the nonmagnetic layer 7 exceeds the above-mentioned range, oxides, metallic nitrides and metallic carbides remain among metallic particles, which may impair the crystallinity and orientation properties of metallic particles. Moreover, since oxides, metallic nitrides and metallic carbides are precipitated above and below the metallic particles, it becomes difficult for the metallic particles to form a continuous columnar structure so as to vertically penetrate through the nonmagnetic layer 7. As a result, the crystallinity and orientation properties of the magnetic layer formed on top of the nonmagnetic layer may be impaired, which is undesirable. On the other hand, when the total content of oxides, metallic nitrides and metallic carbides within the nonmagnetic layer 7 is less than the above-mentioned range, it is not preferable since the effects due to the addition of oxides, metallic nitrides and metallic carbides are not achieved.

In the magnetic recording medium 10 of the present embodiment, as shown in FIG. 1, it is preferable to provide the protective layer 5 on top of the perpendicular magnetic layer 4. The protective layer 5 is provided in order to prevent corrosion of the perpendicular magnetic layer 4, and to protect the surface of the magnetic recording medium from any damage when a magnetic head (refer to the component indicated by the reference numeral 57 in FIG. 3) is brought into contact with the medium. Conventionally known materials can be used for the protective layer 5. For example, a material containing C, $SiO_2$ or $ZrO_2$ can be used.

It is preferable to set the thickness of the protective layer within a range from 1 to 10 nm from the viewpoint of high recording density since the distance between the magnetic head and the magnetic recording medium can be reduced. When the film thickness of the protective layer 5 exceeds the above-mentioned range, the distance between the magnetic head and the magnetic recording medium increases, which may make it impossible to obtain input and output signals of sufficient strength.

Note that in the magnetic recording medium 10 of the present embodiment, it is preferable to further provide the lubricating layer 6 on top of the protective layer 5. In terms of the lubricants to be used in the lubricating layer 6, it is preferable to use perfluoropolyether, fluorinated alcohol, fluorinated carboxylic acid or the like. In addition, the lubricating layer 6 is usually formed with a thickness of 1 to 4 nm.

The magnetic recording medium 10 is configured by adopting the above-mentioned constitutions so that the magnetic recording or reproduction can be conducted by the magnetic head (refer to the magnetic head 57 in the magnetic recording and reproducing apparatus 50 shown in FIG. 3) on the magnetic recording pattern (not shown) formed by the perpendicular magnetic layer 4 and the nonmagnetic layer 7. Since the magnetic recording medium 10 of the present embodiment is obtained by the following manufacturing method according to the present invention, excellent levels of recording and reproduction characteristics and thermal fluctuation characteristics can be ensured, which makes the recording medium applicable for high density recording.

[Method for Manufacturing a Magnetic Recording Medium]

The method for manufacturing a magnetic recording medium according to the present embodiment will be described below in detail by referring to FIGS. 1 to 3 where appropriate.

As described above, the method for manufacturing the magnetic recording medium 10 according to the present embodiment is a method including:

a step for at least forming the orientation control layer 3 on the nonmagnetic substrate 1 which controls the orientation properties of a layer immediately above; and a step for forming the perpendicular magnetic layer 4 by a sputtering process in which the axis of easy magnetization is mainly oriented perpendicularly with respect to the nonmagnetic substrate 1, wherein in the step for forming the perpendicular magnetic layer 4, at least a portion of the perpendicular magnetic layer 4 is formed as a magnetic layer having a granular structure that contains Co as a major component and also contains an oxide of at least one nonmagnetic metal selected from the group consisting of Cr, Si, Ta, Al, Ti, W and Mg, a target for forming the perpendicular magnetic layer 4 by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target higher than the proportion of oxygen contained in the perpendicular magnetic layer 4, and a sputtering gas pressure at the time of forming the perpendicular magnetic layer is set to 1 Pa or less.

In the manufacturing method of the present embodiment, for example, it can be configured such that the method has a step for forming the soft magnetic underlying layer 2 on top of the nonmagnetic substrate 1, followed by the respective steps for forming the orientation control layer 3, the nonmagnetic underlayer 8, the perpendicular magnetic layer 4 and nonmagnetic layer 7, the protective layer 5 and the lubricating layer 6, in this order. Note that in the method for manufacturing the magnetic recording medium 10 according to the present invention, conventionally known methods can be employed for the steps other than the step for forming the perpendicular magnetic layer 4. Therefore, in the present embodiment, detailed descriptions on the respective steps for forming the orientation control layer 3, the nonmagnetic underlayer 8, the nonmagnetic layer 7, the protective layer 5 and the lubricating layer 6 will be omitted.

In the present embodiment, in order to improve both the recording and reproduction characteristics and thermal fluctuation characteristics of the magnetic recording medium 10, the following method is adopted regarding the step for forming the perpendicular magnetic layer 4 by a sputtering process.

In order to enhance the extent of magnetic separation and isolation of magnetic crystal particles constituting the perpendicular magnetic layer 4, at least a portion of the perpendicular magnetic layer 4 is formed as a magnetic layer having a granular structure that contains Co as a major component and also contains an oxide of at least one nonmagnetic metal selected from the group consisting of Cr, Si, Ta, Al, Ti, W and Mg.

In addition, in the manufacturing method of the present embodiment, as a target for forming the perpendicular magnetic layer 4 by a sputtering process, a material containing an oxide of Co and a compound of Co and a nonmagnetic metal is used. Due to this, the level of magnetic flux flowing through the target during a magnetron sputtering process can be increased by reducing the content of a ferromagnetic Co mother alloy contained in the target and by lowering the extent of target magnetization so as to reduce the level of magnetic permeability. As a result, by selecting appropriate sputtering conditions, it becomes possible to enhance the controllability of film quality.

Moreover, in the manufacturing method of the present embodiment, the sputtering gas pressure at the time of forming the perpendicular magnetic layer 4 is set low at 1 Pa or less. As a result, it becomes possible to increase the density of the formed perpendicular magnetic layer 4, thereby improving the hardness of the perpendicular magnetic layer 4.

Furthermore, in the manufacturing method of the present embodiment, the proportion of oxygen contained in the target is made higher than the proportion of oxygen contained in the perpendicular magnetic layer 4. As a result, even when oxygen is eliminated from the perpendicular magnetic layer 4 during the film formation, it is possible to compensate for the eliminated oxygen by the oxygen contained in the target in excess, more specifically, the oxygen within cobalt oxide. Accordingly, it is possible to form the perpendicular magnetic layer 4 exhibiting excellent magnetic separation properties, having isolated magnetic crystal particles, and exhibiting high levels of film density and hardness.

Here, when forming a magnetic layer having a composition of, for example, $90CoCrPt-10(SiO_2)$ by a sputtering process, the film formation is usually conducted using a target having the identical composition to that of the magnetic layer. However, since the CoCrPt alloy is ferromagnetic, a target containing this alloy in an amount of at least 90% is also ferromagnetic. For this reason, even when conducting a magnetron sputtering process using such targets, the magnetic flux of the magnetron does not permeate well through the targets, which makes it impossible to carry out a film forming process with a high degree of controllability.

On the other hand, in the manufacturing method according to the present invention, since Si and oxygen contained in the target can be made into a nonmagnetic compound with Co and a nonmagnetic cobalt oxide, respectively, the amount of ferromagnetic Co alloy contained in the target can be reduced, thereby lowering the magnetism level of target.

Furthermore, in the manufacturing method according to the present invention, since the amount of oxygen supply from the target can be increased due to the formation of the perpendicular magnetic layer 4 by reducing the sputtering gas pressure to 1 Pa or less, it is possible to further increase the content of cobalt oxide in the target. Accordingly, the magnetism level of the target used for forming the perpendicular magnetic layer 4 by a sputtering process can be reduced even further. In other words, in the manufacturing method according to the present invention, reduction of the gas pressure during the sputtering process leads to the formation of highly dense film, as a result of which the content of cobalt oxide in the target is increased due to the requirement for increasing the amount of oxygen supply from the target. As a result, a synergistic effect is achieved in that the magnetism level of the target declines and the level of magnetron controllability during the sputtering process increases.

In the manufacturing method of the present embodiment, it is particularly desirable to set the proportion of oxygen contained in the target within a range from 1.2 to 4 times as high as the proportion of oxygen contained in the lower magnetic layer 4a and intermediate magnetic layer 4b in the step for forming the perpendicular magnetic layer 4 (that is, the lower magnetic layer 4a and intermediate magnetic layer 4b in this case). This is because when the above-mentioned value is less than 1.2 times the proportion of oxygen contained in the perpendicular magnetic layer 4, the formation of a grain boundary of oxide becomes unsatisfactory due to the shortage of oxygen, whereas the value exceeding 4 times the proportion of oxygen contained in the perpendicular magnetic layer 4 results in the oxidation of Co and the decline in the magnetism level. As a result, when a film formation is carried out by a sputtering process at a low pressure of 1 Pa or less, it is possible to form a perpendicular magnetic layer with even higher levels of film density and hardness.

For example, when forming a magnetic layer having a granular structure composed of 92.3 mol % of Co and 7.7 mol % of $SiO_2$, a target material having the identical element ratio is used in the film formation by a conventional sputtering process that employs commonly adopted conditions. In this case, for example, a target composed of 92.3 mol % of Co and 7.7 mol % of $SiO_2$, or a target composed of Co (79.9 atomic %) —Si (6.7 atomic %) —O (13.4 atomic %) is used.

On the other hand, in the manufacturing method according to the present invention, since the amount of oxygen contained in the target is made within a range from 1.2 to 4 times the proportion of oxygen contained in the magnetic layer, when forming the same magnetic layer as that in the above example, the element ratio in the target is within a range from Co (79.9) —Si (6.7) —O (26.8) to Co (79.9) —Si (6.7) —O (53.6) (values in the parentheses indicate the atomic ratio of each element). In addition, in the manufacturing method according to the present invention, an oxide of Co and a compound of Co and a nonmagnetic metal are used as the compounds that constitute the target. For this reason, when all of $SiO_2$ which is the oxide constituting the granular structure of the magnetic layer is prepared as the compounds formed with Co, the element ratio Co (79.9) —Si (6.7) —O (26.8) (values in the parentheses indicate the atomic ratio of each element) becomes Co (79.9-6.7-26.8) —CoSi (6.7) —CoO (26.8) (values in the parentheses indicate the atomic ratio of each element). When the ratio is expressed in mol %, it can be expressed as Co (58 mol %) —CoSi (8.4 mol %) —CoO (33.6 mol %). Likewise, the element ratio Co (79.9) —Si (6.7) —O (53.6) becomes Co (79.9-6.7-53.6) —CoSi (6.7) —CoO (53.6), and when the ratio is expressed in mol %, it can be expressed as Co (24.4 mol %) —CoSi (8.4 mol %) —CoO (67.2 mol %).

Further, in the present embodiment, in the step for forming the perpendicular magnetic layer 4, it is preferable that the content of oxides contained in the perpendicular magnetic layer 4 be within a range from 3 to 18 mol % with respect to the total molar amount of elements constituting magnetic particles of the perpendicular magnetic layer 4. The reason for this is that when the content of oxides is not more than 3 mol %, the magnetic particles 42 do not separate but bind to each other, thereby increasing the noise, whereas the oxide content of not less than 18 mol % reduces the volume occupied by the magnetic particles 42 relative to the entire volume and also reduces the output, although the magnetic particles 42 separate from each other. By forming the perpendicular magnetic layer 4 that includes 3 to 18 mol % of oxides due to such reasons, the precipitation of oxides is formed in the periphery of the magnetic particles 42, thereby promoting the isolation and micronization of the magnetic particles 42.

Further, in the present embodiment, in the step for forming the perpendicular magnetic layer 4, it is more preferable that the magnetic particles 42 of the perpendicular magnetic layer 4 be formed as a columnar crystal continuous from the particles constituting the orientation control layer 3. Due to this configuration, the orientation and crystallinity of the magnetic particles 42 in the perpendicular magnetic layer 4 become satisfactory, and as a result, the magnetic recording medium 10 having an S/N ratio suitable for high density recording can be obtained.

Note that in the manufacturing method of the present embodiment, in the step for forming the orientation control layer 3, oxygen or nitrogen may be introduced into a gas for forming the layer. For example, when a sputtering process is employed as a method for forming the orientation control layer 3, as a gas for forming the layer, a gas prepared by mixing oxygen with argon at a volume ratio of about 0.05 to 50% (preferably about 0.1 to 20%), a gas prepared by mixing nitrogen with argon at a volume ratio of about 0.01 to 20% (preferably about 0.02 to 10%) or the like is suitably used.

According to the method for manufacturing the magnetic recording medium of the present embodiment as described above, the method is such that at least a portion of the perpendicular magnetic layer 4 is formed as a magnetic layer having a granular structure that contains Co as a major component and also contains an oxide of at least one nonmagnetic metal selected from the group consisting of Cr, Si, Ta, Al, Ti, W and Mg, a target for forming the perpendicular magnetic layer 4 by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target higher than the proportion of oxygen contained in the perpendicular magnetic layer 4, and a sputtering gas pressure at the time of forming the perpendicular magnetic layer is set to 1 Pa or less.

Therefore, even when the gas pressure is low, the perpendicular magnetic layer 4 can be formed while strictly controlling the film forming conditions and stabilizing the concentration of oxygen contained in the film. Due to this configuration, it is possible to form the perpendicular magnetic layer 4 having a high density and hardness and also exhibiting excellent electromagnetic conversion characteristics. Therefore, it becomes possible to manufacture a magnetic recording medium 10 which is excellent in terms of both the recording and reproduction characteristics and thermal fluctuation characteristics.

Further, the magnetic recording medium 10 which is obtained by the manufacturing method of the present invention is excellent in terms of both the recording and reproduction characteristics and thermal fluctuation characteristics, and can also be applied for high density recording.

[Magnetic Recording and Reproducing Apparatus]

Next, the configuration of a magnetic recording and reproducing apparatus (a hard disk drive) according to the present invention is shown in FIG. 3. A magnetic recording and reproducing apparatus 50 according to the present invention includes, as shown in FIG. 3, the magnetic recording medium 10 described above according to the present invention, a medium driving section 51 that drives the medium in the recording direction, the magnetic head 57 composed of a recording section and a reproducing section, the head driving section 58 for moving the magnetic head 57 relative to the magnetic recording medium 10, and the recording/reproducing signal processing device 59 for supplying input signals to the magnetic head 57 and reproducing output signals from the magnetic head 57. By combining these components, the magnetic recording and reproducing apparatus 50 which can achieve a high recording density can be configured. Since the magnetic recording and reproducing apparatus 50 of the present embodiment is constituted by employing the magnetic recording medium 10 having the above-mentioned configuration, the apparatus exhibits an adequate level of reproduction output and a high level of SNR and also excellent floating properties of the magnetic head 57, is capable of carrying out a precise magnetic recording and reproducing operation, and achieves excellent high density recording characteristics.

Furthermore, in the present embodiment, by configuring a reproducing element of the magnetic head 57 described above from a giant magnetoresistance (GMR) head or the like using a GMR effect, an adequate level of signal strength can be obtained even in the high recording density, which makes it possible to attain a magnetic recording and reproducing apparatus which can achieve a high level of recording density.

EXAMPLES

Next, the method for manufacturing a magnetic recording medium, the magnetic recording medium, and the magnetic recording and reproducing apparatus according to the present invention will be described in more detail using a series of examples and comparative examples, although the present invention is in no way limited by these examples.

Example 1

First, a glass substrate for a hard disk (HD) (manufactured by Konica Minolta Holdings, Inc., having an outer shape of 2.5 inches) which was already washed was placed in a deposition chamber of a DC magnetron sputtering apparatus (C-3040 manufactured by Canon ANELVA Corporation), and the deposition chamber was evacuated in advance until an ultimate pressure of $1 \times 10^{-5}$ Pa was achieved.

Next, an adhesive layer having a thickness of 10 nm was formed on the glass substrate using a Cr target. Subsequently, a soft magnetic layer having a thickness of 25 nm was formed using a target having a composition of Co-20Fe-5Zr-5Ta [i.e., an Fe content of 20 at %, a Zr content of 5 at %, a Ta content of 5 at % and the remainder being Co] and setting the substrate temperature to 100° C. or less. Then, a Ru layer having a thickness of 0.7 nm was formed thereon, followed by further formation of a soft magnetic layer composed of Co-20Fe-5Zr-5Ta with a thickness of 25 nm, thereby preparing a soft magnetic underlayer 2.

Next, on top of the soft magnetic underlayer 2, films were formed, first with a thickness of 5 nm using a target having a composition of Ni-6W [i.e., a W content of 6 at % and the remainder being Ni], and then with a thickness of 20 nm using a Ru target, respectively, in this order, thereby preparing an orientation control layer 3.

Then, on top of the orientation control layer 3, using the manufacturing method according to the present invention, a magnetic layer having a granular structure was formed by a sputtering process. In this process, a target composed of 53.5 mol % of Co, 8.4 mol % of CoSi and 38.2 mol % of CoO in which the proportion of oxygen was about 2.3 times the objective proportion of oxygen in the magnetic layer to be formed was used as a target. Then, the sputtering gas pressure and the electric power supplied were adjusted so that the formed magnetic layer was to become a magnetic layer having a granular structure composed of 92.3 mol % of Co and 7.7 mol % of $SiO_2$. In this process, a conventionally known DC magnetron sputtering apparatus was used, Ar was used as a sputtering gas, and a film formation was carried out at a sputtering gas pressure of 0.6 Pa and an electric power supply of 1,000 W (i.e., the electric power applied to the target), thereby forming a perpendicular magnetic layer having a thickness of 9 nm.

Comparative Example 1

A magnetic layer having a granular structure was formed on top of a glass substrate for HD by the same procedures as those described in Example 1 except that a target composed of 75 mol % of Co, 8 mol % of CoSi and 17 mol % of CoO which contained the same amounts of elements as those in the magnetic layer to be formed was used as a target for forming the magnetic layer, and a sputtering gas pressure was set to 4 Pa.

Comparative Example 2

A magnetic layer having a granular structure was formed on top of a glass substrate for HD by the same procedures as those described in Example 1 except that a target composed of 92.3 mol % of Co, 7.7 mol % of $SiO_2$ having the identical composition to that of the magnetic layer to be formed was used as a target for forming the magnetic layer, and a sputtering gas pressure was set to 4 Pa.

[Evaluation of Perpendicular Magnetic Layers Formed in Example 1 and Comparative Examples 1 and 2]

The organizations of the magnetic layers formed in the above-mentioned Example 1 and Comparative Examples 1 and 2 and having a granular structure were observed using a transmission electron microscope (TEM). As shown in micrographs of FIGS. 4A through 4C, in the magnetic layer formed in Example 1 (shown in FIG. 4A), the grain boundary portions between the magnetic particles can be clearly identified as compared to those in Comparative Example 1 (shown in FIG. 4B) and Comparative Example 2 (shown in FIG. 4C), and thus it can be assumed that the domains for magnetic particles and those for oxide particles were separated in a satisfactory manner.

Example 2

First, a glass substrate for an HD (manufactured by Konica Minolta Holdings, Inc., having an outer shape of 2.5 inches) which was already washed was placed in a deposition chamber of a DC magnetron sputtering apparatus (C-3040 manufactured by Canon ANELVA Corporation), and the deposition chamber was evacuated in advance until an ultimate pressure of $1 \times 10^{-5}$ Pa was achieved.

Next, an adhesive layer having a thickness of 10 nm was formed on the glass substrate using a Cr target. Subsequently, a soft magnetic layer having a thickness of 25 nm was formed using a target having a composition of Co-20Fe-5Zr-5Ta [i.e., an Fe content of 20 at %, a Zr content of 5 at %, a Ta content of 5 at % and the remainder being Co] and setting the substrate temperature to 100° C. or less. Then, a Ru layer having a thickness of 0.7 nm was formed thereon, followed by further formation of a soft magnetic layer composed of Co-20Fe-5Zr-5Ta with a thickness of 25 nm, thereby preparing a soft magnetic underlayer 2.

Next, on top of the soft magnetic underlayer 2, films were formed, first with a thickness of 5 nm using a target having a composition of Ni-6W [i.e., a W content of 6 at % and the remainder being Ni], and then with a thickness of 20 nm using a Ru target, respectively, in this order, thereby preparing an orientation control layer 3.

Then, on top of the orientation control layer 3, using the manufacturing method according to the present invention, a lower magnetic layer 4a (perpendicular magnetic layer 4) composed of (Co15Cr16Pt)91-($SiO_2$)6-($TiO_2$)3 [i.e., 91 mol % of an alloy having a Cr content of 15 at %, a Pt content of 16 at % and the remainder being Co; 6 mol % of an oxide consisted of $SiO_2$; and 3 mol % of an oxide consisted of $TiO_2$] and having a granular structure was formed by a sputtering process. In this process, a target composed of 10 mol % of Co, 15 mol % of Cr, 16 mol % of Pt, 49 mol % of CoO, 7 mol % of CoSi, and 3 mol % of CoTi in which the proportion of oxygen was about 2.5 times the objective proportion of oxygen in the magnetic layer to be formed was used as a target. In this process, a conventionally known DC magnetron sputtering apparatus was used, Ar was used as a sputtering gas, and a film formation was carried out at a sputtering gas pressure of 0.6 Pa and an electric power supply of 1,000 W (i.e., the electric power applied to the target), thereby forming a lower magnetic layer 4a having a thickness of 9 nm.

Subsequently, on top of the lower magnetic layer 4a, a nonmagnetic layer 7a composed of (Co30Cr)88-($TiO_2$)12 and having a thickness of 0.3 nm was formed.

Then, on top of the nonmagnetic layer 7a, an intermediate magnetic layer 4b composed of (Co11Cr18Pt)91-($SiO_2$)6-($TiO_2$)3 was formed in the same manner as that described above for forming the lower magnetic layer 4a. Note that the film thickness of the intermediate magnetic layer 4b was 6 nm.

Subsequently, on top of the intermediate magnetic layer 4b, a nonmagnetic layer 7b composed of Ru and having a thickness of 0.3 nm was formed.

Then, on top of the nonmagnetic layer 7b, an upper magnetic layer 4c having a thickness of 7 nm was formed using a target composed of Co20Cr14Pt3B [i.e., a Cr content of 20 at %, a Pt content of 14 at %, a B content of 3 at % and the remainder being Co] and setting a sputtering gas pressure at 0.6 Pa.

Thereafter, on the surface of the upper magnetic layer 4c, using a high-frequency plasma chemical vapor deposition (CVD) process, a protective layer 5 composed of a carbon (C) material was formed with a film thickness of 3.0 nm.

Subsequently, on top of the protective layer 5, a lubricating layer 6 composed of perfluoropolyether was formed through a dipping method, to thereby produce a magnetic recording medium.

Then, the magnetic recording and reproducing characteristics were determined with regard to the magnetic recording media manufactured by the above-mentioned method using a read/write analyzer (RWA1632 model, manufactured by Guzik Technical Enterprises, USA) and a spin-stand (S1701MP model). In this process, in terms of the magnetic head for evaluation, a magnetic head using a single pole magnetic pole was used for writing, whereas a magnetic head using a TMR element was used for reading.

In the present Example, the S/N ratio was measured when signals were recorded at a recording density of 750 kFCI.

Further, recording characteristics (i.e., OW characteristics) were evaluated by first writing a signal of 750 kFCI and then overwriting it with a signal of 100 kFCI, followed by extraction of high frequency components with a frequency filter, and the data-writing capability was evaluated based on the residual ratio thereof.

In addition, the thermal fluctuation characteristics were evaluated by conducting a writing at a recording density of 50 kFCI under the condition of 70° C. and then calculating the attenuation factor of the output relative to the reproduction output one second after the writing on the basis of a formula: (So−S)×100/(So). In this formula, So denotes the reproduction output one second after the writing and S denotes the reproducing output 10,000 seconds after the writing.

As a result of the above-mentioned respective evaluation tests, it was confirmed that the magnetic recording medium according to the present invention prepared in Example 2 exhibited an S/N ratio of 18.1 dB, OW characteristics of 37.9 dB, and thermal fluctuation characteristics of 0.4%, and thus had excellent electromagnetic conversion characteristics.

Comparative Example 3

A magnetic recording medium was manufactured by the same procedures as those described in Example 2 except that a target having the identical composition to that of the magnetic layer [i.e., (Co15Cr16Pt)91-($SiO_2$)6-($TiO_2$)3] was used as a target for forming the lower magnetic layer and intermediate magnetic layer by a sputtering process, and a sputtering gas pressure was set to 2 Pa.

The magnetic recording medium obtained in Comparative Example 3 exhibited an S/N ratio of 17.5 dB, OW characteristics of 36.2 dB, and thermal fluctuation characteristics of 0.6%, and thus the electromagnetic conversion characteristics thereof were poor as compared to those of the above-mentioned magnetic recording medium according to the present invention prepared in Example 2.

[Evaluation of Magnetic Recording Media Manufactured in Example 2 and Comparative Example 3 on Scratch Resistance]

Evaluation of the magnetic recording media manufactured in the above-mentioned Example 2 and Comparative Example 3 on scratch resistance was carried out using the SAF tester manufactured by Kubota Comps Corporation and an optical surface analysis apparatus (OSA) manufactured by Candela Corporation. The measurements were made under the conditions of a disk rotational frequency of 5,000 rpm, a barometric pressure of 100 Torr and room temperature. Further, in terms of the measuring method, the head was held while being loaded by the SAF tester for 2,000 seconds, and the number of scratches made as a result was then inspected by the OSA.

As shown in the graph of FIG. 5, in the magnetic recording medium manufactured in Example 2, since the number of scratch counts made by the OSA was considerably low as compared to that in the magnetic recording medium manufactured in Comparative Example 3, it is assumed that a magnetic film having a high density as well as high hardness was formed therein.

Comparative Example 4

A magnetic recording medium was manufactured by the same procedures as those described in Example 2 except that a target having the identical composition to that of the magnetic layer [i.e., (Co15Cr16Pt)91-($SiO_2$)6-($TiO_2$)3] was used as a target for forming the lower magnetic layer and intermediate magnetic layer by a sputtering process, and a sputtering gas pressure was set to 1.2 Pa.

The magnetic recording medium obtained in Comparative Example 4 exhibited an S/N ratio of 16.8 dB, OW characteristics of 35.4 dB, and thermal fluctuation characteristics of 0.9%, and thus the electromagnetic conversion characteristics thereof were poor as compared to those of the above-mentioned magnetic recording medium according to the present invention prepared in Example 2.

From the results shown above, it is clear that the magnetic recording medium obtained by the manufacturing method according to the present invention was excellent in terms of both the recording and reproduction characteristics and thermal fluctuation characteristics, exhibited superior electromagnetic conversion characteristics, and can also be applied for high density recording.

The method for manufacturing a magnetic recording medium according to the present invention is capable of manufacturing a magnetic recording medium having superior electromagnetic conversion characteristics with high productivity by applying the method to a step for manufacturing a magnetic recording medium used in a magnetic recording and reproducing apparatus, a so-called hard disk drive, and thus, the method is invaluable in terms of industrial applicability.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A method for manufacturing a magnetic recording medium, the method comprising:

a step for forming at least an orientation control layer on a nonmagnetic substrate which controls the orientation properties of a layer immediately above; and a step for forming a perpendicular magnetic layer by a sputtering process in which the axis of easy magnetization is mainly oriented perpendicularly with respect to the nonmagnetic substrate, wherein in the step for forming a perpendicular magnetic layer, at least a portion of the perpendicular magnetic layer is formed as a magnetic layer having Co as a major component and a granular structure which includes an oxide of at least one nonmagnetic metal selected from the group consisting of Cr, Si, Ta, Al, Ti, W and Mg, wherein a target for forming the perpendicular magnetic layer by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target within a range from 2.3 to 4 times higher than the proportion of oxygen contained in the perpendicular magnetic layer, and a sputtering gas pressure at the time of forming the perpendicular magnetic layer is set to 1 Pa or less, and wherein in the step for forming a perpendicular magnetic layer, magnetic particles of the perpendicular magnetic layer are formed as a columnar crystal continuous from particles which constitute the orientation control layer, and wherein in the step for forming a perpendicular magnetic layer, a content of oxides contained in the perpendicular magnetic layer is within a range from 3 to 18 mol % with respect to the total molar amount of elements constituting magnetic particles of the perpendicular magnetic layer.

2. The method for manufacturing a magnetic recording medium according to claim 1, wherein in the step for forming a perpendicular magnetic layer, the proportion of oxygen contained in the target is within a range from 2.5 to 4 times higher than the proportion of oxygen contained in the perpendicular magnetic layer.

3. The method for manufacturing a magnetic recording medium according to claim 1, wherein in the step for forming a perpendicular magnetic layer, the target for forming the perpendicular magnetic layer by the sputtering process is prepared so as to consist essentially of Co or Co alloy, an oxide of Co, and a compound of Co and at least one nonmagnetic metal selected from the group consisting of Cr, Si, Ta, Al, Ti, W and Mg.

4. The method for manufacturing a magnetic recording medium according to claim 1, wherein in the step for forming a perpendicular magnetic layer, the target for forming the perpendicular magnetic layer by the sputtering process is prepared so as to consist essentially of CoCrPt alloy, an oxide of Co, and a compound of Co and Si.

5. The method for manufacturing a magnetic recording medium according to claim 1, wherein in the step for forming a perpendicular magnetic layer, the proportion of oxygen contained in the target be capable of compensating for an eliminated oxygen in the perpendicular magnetic layer from the oxygen in excess contained within the oxide of Co in the target.

6. The method for manufacturing a magnetic recording medium according to claim 1, wherein in the step for forming a perpendicular magnetic layer, the perpendicular magnetic layer is directly formed on the orientation control layer.

7. The method for manufacturing a magnetic recording medium according to claim 1, wherein in the step for forming a perpendicular magnetic layer, the perpendicular magnetic layer is formed on a nonmagnetic base layer provided on the orientation control layer.

8. A method for manufacturing a magnetic recording medium, the method comprising:

a step for forming at least an orientation control layer on a nonmagnetic substrate which controls the orientation properties of a layer immediately above; and a step for forming two or more perpendicular magnetic layers by a sputtering process in which the axis of easy magnetization is mainly oriented perpendicularly with respect to the nonmagnetic substrate, wherein, in the step for forming two or more perpendicular magnetic layers, the perpendicular magnetic layers include a lower magnetic layer that is the nearest layer to the nonmagnetic substrate among the perpendicular magnetic layers, and the lower magnetic layer is formed by a sputtering process in which the axis of easy magnetization is mainly oriented perpendicularly with respect to the nonmagnetic substrate, wherein in the step for forming the lower magnetic layer, at least a portion of the lower magnetic layer is formed as a magnetic layer having Co as a major component and a granular structure which includes an oxide of at least one nonmagnetic metal selected from the group consisting of Cr, Si, Ta, Al, Ti, W and Mg, wherein a target for forming the lower magnetic layer by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target within a range from 2.3 to 4 times higher than the proportion of oxygen contained in the lower magnetic layer, and a sputtering gas pressure at the time of forming the lower magnetic layer is set to 1 Pa or less, and wherein in the step for forming the lower magnetic layer, magnetic particles of the lower magnetic layer are formed as a columnar crystal continuous from particles which constitute the orientation control layer, and wherein in the step for forming the lower magnetic layer, a content of oxides contained in the lower magnetic layer is within a range from 3 to 18 mol % with respect to the total molar amount of elements constituting magnetic particles of the lower magnetic layer.

9. A method for manufacturing a magnetic recording medium, the method comprising:
   a step for forming at least an orientation control layer on a nonmagnetic substrate which controls the orientation properties of a layer immediately above; and
   a step for forming two or more perpendicular magnetic layers by a sputtering process in which the axis of easy magnetization is mainly oriented perpendicularly with respect to the nonmagnetic substrate,
   wherein, in the step for forming two or more perpendicular magnetic layers, the perpendicular magnetic layers include a lower magnetic layer and an intermediate magnetic layer in this order from the nonmagnetic substrate side, and
   the lower magnetic layer and the intermediate magnetic layer are formed by a sputtering process in which the axis of easy magnetization is mainly oriented perpendicularly with respect to the nonmagnetic substrate, wherein in the step for forming the lower magnetic layer and the intermediate magnetic layer, at least a portion of the lower magnetic layer and the intermediate magnetic layer is formed as a magnetic layer having Co as a major component and a granular structure which includes an oxide of at least one nonmagnetic metal selected from the group consisting of Cr, Si, Ta, Al, Ti, W and Mg, wherein a target for forming the lower magnetic layer and the intermediate layer by the sputtering process is prepared so as to include an oxide of Co and a compound of Co and at least one nonmagnetic metal selected from the group consisting of Cr, Si, Ta, Al, Ti, W and Mg, and to make the proportion of oxygen contained in the target within a range from 2.3 to 4 times higher than the proportion of oxygen contained in the lower magnetic layer and the intermediate magnetic layer, and a sputtering gas pressure at the time of forming the lower magnetic layer is set to 1 Pa or less, and wherein in the step for forming the lower magnetic layer and the intermediate magnetic layer, magnetic particles of the lower magnetic layer and intermediate magnetic layer are formed as a columnar crystal continuous from particles which constitute the orientation control layer, and wherein in the step for forming the lower magnetic layer and the intermediate layer, a content of oxides contained in the lower magnetic layer and the intermediate layer is within a range from 3 to 18 mol % with respect to the total molar amount of elements constituting magnetic particles of the lower magnetic layer and the intermediate layer.

\* \* \* \* \*